(12) United States Patent
Nam

(10) Patent No.: US 8,551,861 B2
(45) Date of Patent: Oct. 8, 2013

(54) SEMICONDUCTOR DEVICE AND METHOD FOR MANUFACTURING THE SAME

(75) Inventor: Ki Bong Nam, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 225 days.

(21) Appl. No.: 12/976,485

(22) Filed: Dec. 22, 2010

(65) Prior Publication Data

US 2011/0175171 A1    Jul. 21, 2011

(30) Foreign Application Priority Data

Jan. 18, 2010   (KR) .................. 10-2010-0004409

(51) Int. Cl.
*H01L 21/76*     (2006.01)
*H01L 21/425*    (2006.01)
*H01L 29/76*     (2006.01)
*H01L 29/00*     (2006.01)

(52) U.S. Cl.
USPC ........... 438/435; 438/449; 438/514; 257/374; 257/499; 257/501

(58) Field of Classification Search
USPC .......... 438/433, 435, 449, 450, 514; 257/374, 257/396, 499, 501, 506, 510
See application file for complete search history.

(56) References Cited

U.S. PATENT DOCUMENTS

| | | | | |
|---|---|---|---|---|
| 6,242,323 B1 * | 6/2001 | Ishitsuka et al. | ............... | 438/435 |
| 6,486,039 B2 * | 11/2002 | Yoo et al. | .................... | 438/425 |
| 6,576,558 B1 * | 6/2003 | Lin et al. | ..................... | 438/700 |
| 6,943,098 B2 * | 9/2005 | Yeh et al. | ..................... | 438/525 |
| 2008/0153255 A1 * | 6/2008 | Park | ............................ | 438/433 |

FOREIGN PATENT DOCUMENTS

| | | |
|---|---|---|
| KR | 1020050011464 A | 1/2005 |
| KR | 1020050052007 A | 6/2005 |
| KR | 1020050052625 A | 6/2005 |
| KR | 1020070002903 A | 1/2007 |

* cited by examiner

*Primary Examiner* — Hsien Ming Lee

(57) ABSTRACT

A semiconductor device and a method for manufacturing the same are disclosed. A method for manufacturing a semiconductor device includes forming a trench for defining an active region over a semiconductor substrate, forming a doped region by implanting impurities into the trench, forming an oxide film in the trench by performing an oxidation process, forming a nitride film at inner sidewalls of the trench, and forming a device isolation film in the trench.

18 Claims, 7 Drawing Sheets

SEMICONDUCTOR DEVICE AND METHOD FOR MANUFACTURING THE SAME

CROSS-REFERENCE TO RELATED APPLICATION

The priority of Korean patent application No. 10-2010-0004409 filed on 18 Jan. 2010, the disclosure of which is hereby incorporated in its entirety by reference, is claimed.

BACKGROUND OF THE INVENTION

Embodiments of the present invention relate to a method for manufacturing a highly-integrated semiconductor device, and more particularly to a method for manufacturing a semiconductor device having a buried word line that is stably operated in a highly-integrated semiconductor memory device.

A semiconductor memory device includes a plurality of unit cells each having a capacitor and a transistor. The capacitor is used to temporarily store data, and the transistor is used to transfer data between a bit line and the capacitor in response to a control signal (word line). The data transfer occurs using semiconductor properties where electrical conductivity changes depending on environments. The transistor has three regions, i.e., a gate, a source, and a drain. Electrical charges are moved between the source and the drain according to a control signal inputted to the gate of the transistor. The movement of the electric charges between the source and the drain occurs through a channel region.

A channel region of the transistor is formed in an active region of a semiconductor substrate, and the active region is defined by a device isolation film. The device isolation film may be formed by a shallow trench isolation (STI) process. In more detail, the STI process includes: forming a trench in the semiconductor substrate; and filling in the trench with insulation material.

As data storage capacity of the semiconductor memory device and the integration degree thereof are increased, the necessity of manufacturing a smaller-sized unit cell is increasing. The reduction in design rules requires a distance between one active region and a neighboring active region to be reduced. If the active region is reduced in size, a contact area coupling an overlying device element to the active region is reduced, and contact resistance between the active region and the contact is increased accordingly. In order to overcome the shortcomings and increase the integration degree, it is necessary to reduce a distance between the active regions without reducing the size of the active regions.

To make the distance between neighboring active regions shorter, the width of a device isolation trench defining each active region becomes narrower. Meanwhile, in order to reduce interference between the neighboring active regions, the trench must be deeply formed. Preferably, the depth of the device isolation trench is greater than the width of the trench. In order to prevent a void from being generated in a device isolation pattern, an insulation film should completely fill the device isolation trench in order to prevent an unnecessary electric field and to ensure stable operation of the semiconductor device.

Typically, before an insulation material fills up a trench in which a device isolation film for defining the active region is to be formed, an oxide film and a nitride film are formed in the trench. The oxide film and the nitride film are formed to prevent a Hot Electron Induced Punch-Through (HEIP) phenomenon in a PMOS transistor as well as to reduce a leakage current of a semiconductor device. The oxide film and the nitride film cause the trench width to be narrower, so that it is difficult to fill the trench with an insulation material without generating any voids. In addition, an oxide film formed in the trench may be formed by oxidation of the exposed semiconductor substrate, so over sidewalls of the trench are oxidized and the active region is reduced in size. However, if the oxide film is thinly formed, the purpose of preventing the HEIP phenomenon and leakage current cannot be properly achieved, resulting in deterioration of stability of the semiconductor device.

BRIEF SUMMARY OF THE INVENTION

Various embodiments of the present invention are directed to providing a semiconductor device and a method for manufacturing the same that substantially obviate one or more problems due to limitations and disadvantages of the related art.

An object of the present invention is to provide a method for manufacturing a semiconductor device having a buried word line that is stably operated in a highly-integrated semiconductor memory device.

In accordance with an aspect of the present invention, a method for manufacturing a semiconductor device comprising: forming a trench for defining a first active region and a second active region over a semiconductor substrate, the trench being provided between first and second active regions; forming a doped region by implanting impurities into the trench; forming an oxide film in the trench by an oxidation process; forming a nitride film at inner sidewalls of the trench; and forming a device isolation film in the trench. The impurities comprise nitrogen.

The method further comprising: forming a gate pattern over the first active region and the second active region.

The forming of the trench defining the first active region and the second active region over the semiconductor substrate includes: depositing a hard mask layer over the semiconductor substrate; patterning the hard mask layer by an exposure process; and etching the semiconductor substrate by using the patterned hard mask layer as an etch mask.

The forming of the doped region by implanting impurities into the trench includes anisotropically implanting the impurities.

The doped region at a lower sidewall and bottom of the trench is thicker than a portion of the doped region at an upper sidewall of the trench.

A thickness of the oxide film formed at inner sidewalls of the trench is different from that of the oxide film formed over the bottom of the trench.

A thickness of the oxide film formed at inner sidewalls of the trench is larger than that of the oxide film formed over the bottom of the trench.

The forming of the nitride film at inner sidewalls of the trench includes: depositing the nitride film over the oxide film; and anisotropically etching the nitride film, and exposing the oxide film formed at the bottom of the trench.

The forming of the device isolation film in the trench includes: depositing an insulation material in the trench; and planarizing the insulation material so that the top surface of the substrate in the active region is exposed.

The first active region and the second active region are formed of a P-type well region, and neighboring P-type well regions are electrically isolated from each other by a N-well region.

In accordance with an aspect of the present invention, a device isolation structure provided between first and second active regions, the device isolation structure provided in a trench; an oxide film having a first portion and a second portion, the first portion of the oxide film being disposed between inner sidewalls of the trench and a side portion of the device isolation structure and the second portion of the oxide film being disposed between a bottom of the trench and a lower portion of the device isolation structure; and a nitride film disposed between the first portion of the oxide film and the side portion of the device isolation structure.

A thickness of the first portion of the oxide film is different from that of the second portion of the oxide film.

A thickness of the first portion of the oxide film is larger than that of the second portion of the oxide film.

A gate pattern formed over the first active region and the second active region.

A P-type well region disposed in the first active region; and an N-type well region disposed at the bottom of the trench so as to isolate neighboring P-type well regions.

The second portion of the oxide film couples the bottom of the device isolation structure and the nitride film couples the side portion of the device isolation structure.

In accordance with an aspect of the present invention, A semiconductor device comprising: a substrate including an active region and a device isolation structure; a first oxide layer formed between an upper sidewall of the device isolation structure and the substrate in the active region; a second oxide layer formed between a lower sidewall of the device isolation structure and the substrate in the active region; and a third oxide layer formed between a bottom of the device isolation structure and the substrate in the device isolation region; wherein the first oxide layer is thicker than the second oxide layer.

The device further comprising: a nitride layer formed between the first oxide layer and the device isolation structure and between the second oxide layer and the device isolation structure, wherein substantially no nitride layer is formed between the third oxide layer and the device isolation structure.

The first and the second oxide layer is in an integrated body and tapered widening upwards.

The active region is formed of a first type well, and the device isolation region is formed of a second type well opposite to the first type well in electric polarity.

DESCRIPTION OF EMBODIMENTS

Reference will now be made in detail to various embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings.

In accordance with a method for manufacturing a highly-integrated semiconductor device according to the present invention, when a device isolation film defining an active region is formed through an STI process, an insulation material can be deposited without any voids, and the HEIP phenomenon of the PMOS transistor and the occurrence of the leakage current can be significantly reduced. Embodiments of the present invention will hereinafter be described with reference to the accompanying drawings.

Figure 1:
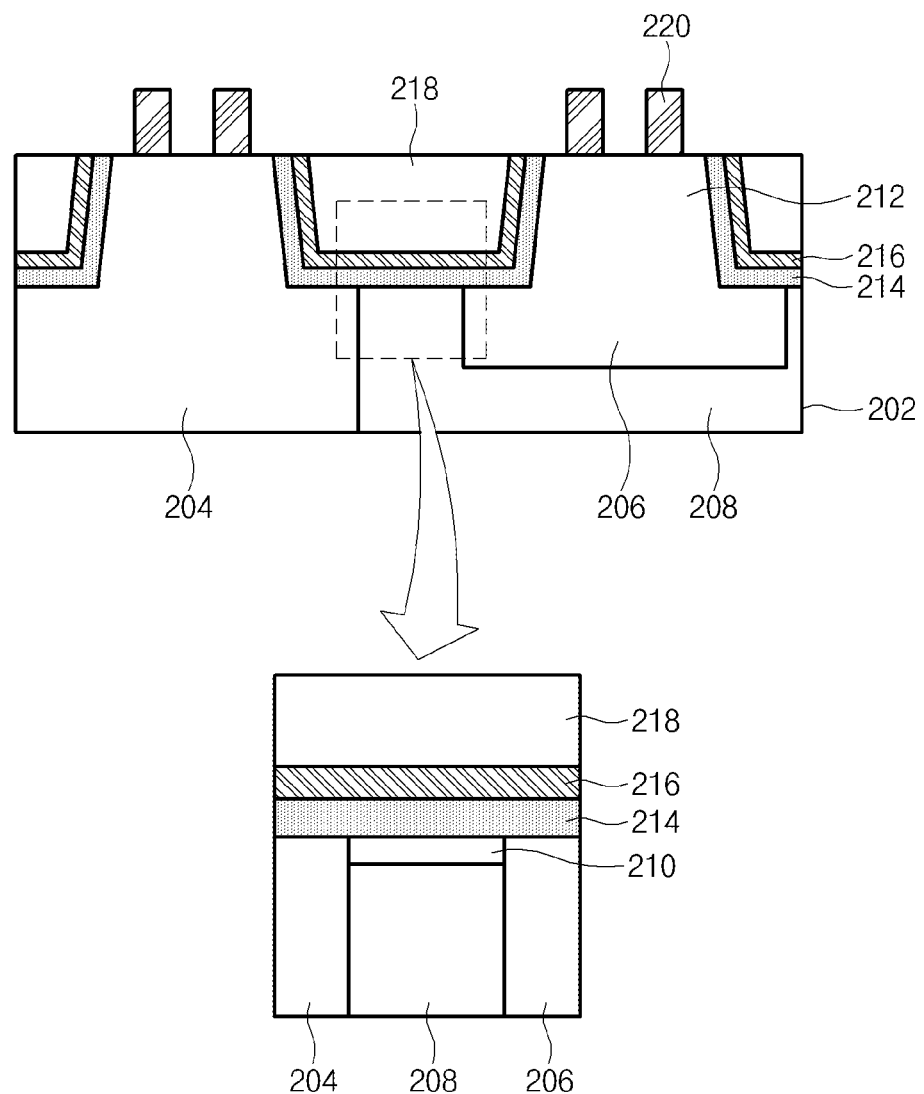
FIG. 1 is a cross-sectional view illustrating a semiconductor device according to an embodiment of the present invention.

FIG. 1 is a cross-sectional view illustrating a semiconductor device according to an embodiment of the present invention.

Referring to FIG. 1, a trench (not shown) for defining an active region 212 is formed over a semiconductor substrate 202. An oxide film 214 and a nitride film 216 are formed in the trench. In order to form the device isolation film 218, insulation material is deposited over the nitride film 216 so as to fill the trench. A gate pattern 220 is formed over the active region 212.

First and second P-type well regions 204 and 206 including P-type impurities, and an N-type well region 208 including doped N-type impurities are formed over the semiconductor substrate 202. In this case, the second P-type well region 206 is formed in the N-type well region 208. Several device elements formed in the same well region may share the same semiconductor substrate 202. Electricity is not supposed to flow between different types of well regions, so that the first P-type well region 204 and the second P-type well region 206 are electrically isolated from each other by the N-type well region 208.

However, as can be seen from the enlarged drawing of FIG. 1, electrons are trapped at an interface between the nitride film 216 and the oxide film 214, so that holes contained in the N-type well region 208 are concentrated at the interface of the oxide film 214 due to the trapped electrons. As opposed to the first and second P-type well regions 204 and 206 in which holes serve as a carrier, holes are concentrated at the interface of the oxide film 214 in the N-type well region 208 in which electrons serve as a carrier, so that a path 210 for electrically coupling the first P-type well region 204 to the second P-type well region 206 may be formed. Through the path 210 formed in the N-type well region 208, a leakage current may occur between the first P-type well region 204 and the second P-type well region 206.

Figure 2:
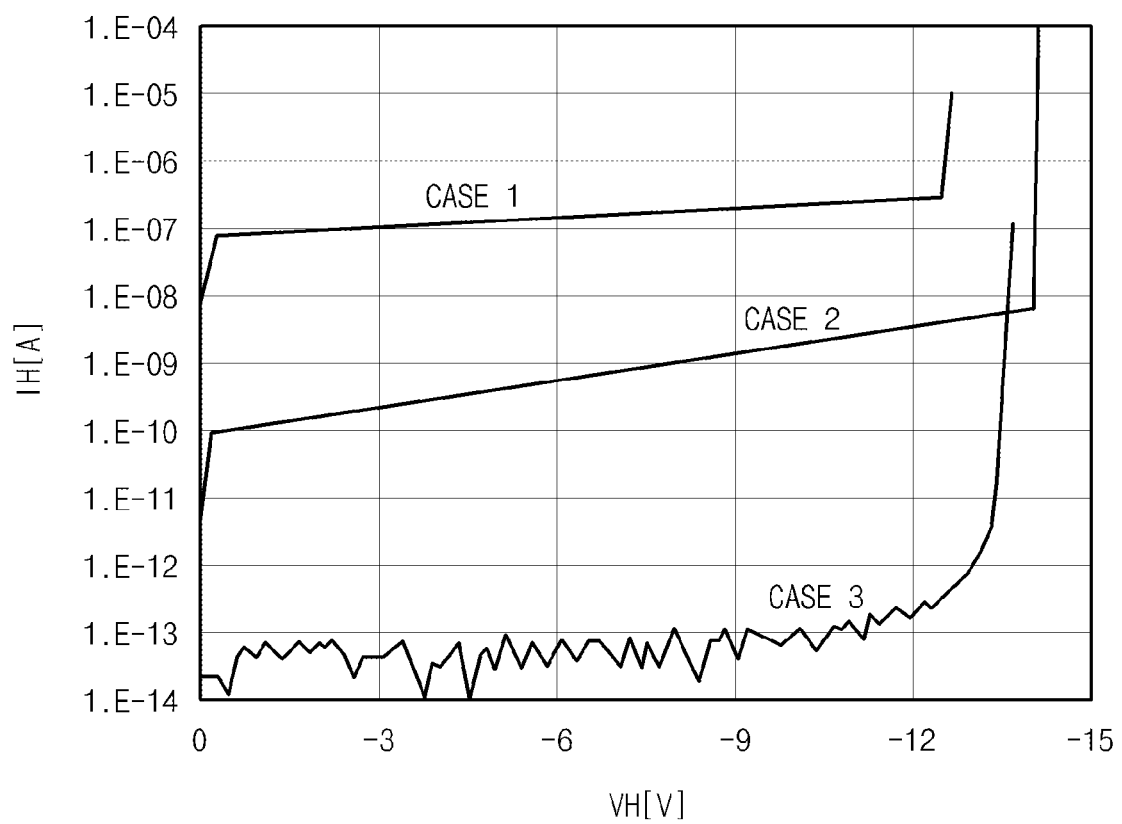
FIG. 2 is a graph illustrating leakage current characteristics depending upon a thickness of an oxide film formed over sidewalls of an active region for a semiconductor device according to an embodiment of the present invention.

FIG. 2 is a graph illustrating leakage current characteristics depending upon a thickness of an oxide film formed over sidewalls of an active region including a semiconductor device according to an embodiment of the present invention.

Referring to FIG. 2, the leakage current of a semiconductor device varies according to a thickness of an oxide film. Leakage currents between the first and second P-type well regions 204 and 206 are measured in response to voltages applied to one of the p-type well regions for different thicknesses of oxide films. The results are shown in FIG. 2. In particular, as can be seen from FIG. 2, voltages are applied to the second P-type well region 206, and leakage currents were measured in the first P-type well region 204. A first case (CASE 1) illustrates a semiconductor device in which an oxide film 214 having a thickness of about 55 Å is used. A second case (CASE 2) illustrates a semiconductor device in which an oxide film 214 having a thickness of about 65 Å is used. Finally, a third case (CASE 3) illustrates a semiconductor device in which an oxide film 214 having a thickness of about 75 Å is used. The thicker the oxide film 214, the less the leakage current amount. As the oxide film 214 becomes thinner, electrical isolation (or insulation) between neighboring well regions deteriorates and the path 210 can be easily formed, such that the leakage current is increased.

Figure 3:
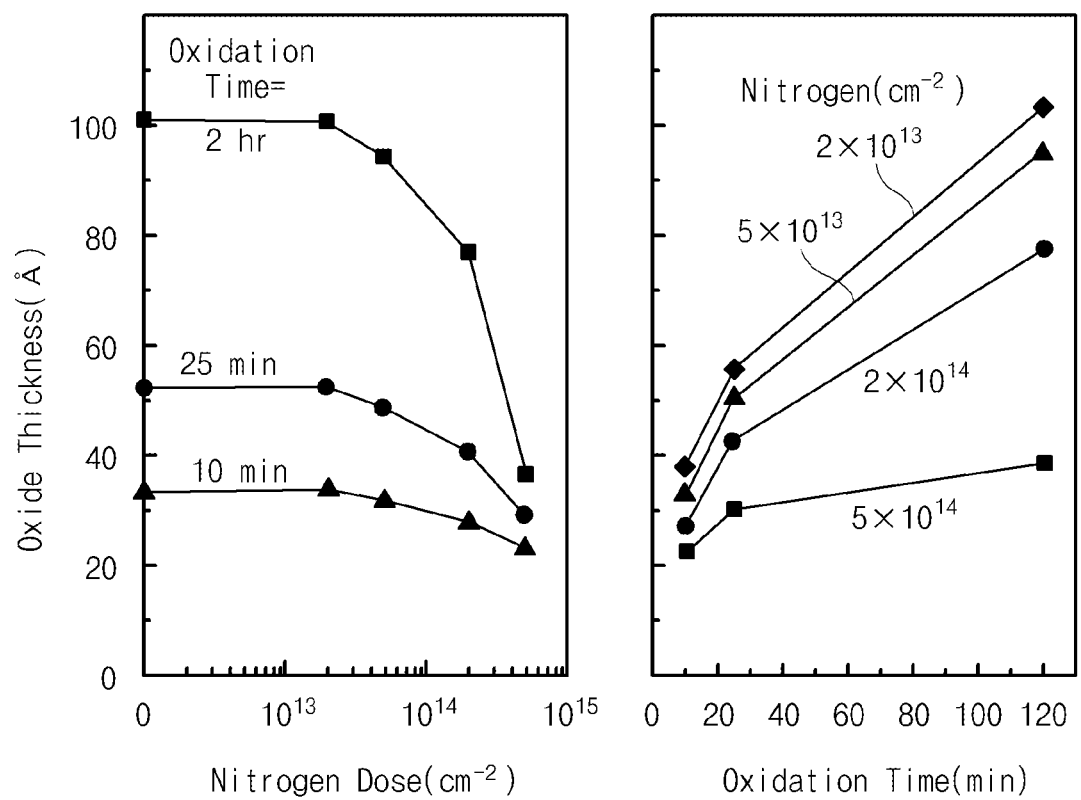
FIG. 3 is a graph illustrating a difference in growth characteristics of an oxide film according to an amount of nitrogen contained in a semiconductor substrate according to an embodiment of the present invention.

FIG. 3 is a graph illustrating a difference in growth characteristics of an oxide film according to an amount of nitrogen contained in a semiconductor substrate.

Referring to FIG. 3, an oxide film ($SiO_2$) thickness formed in an oxidation process depends on the amount of nitrogen contained in the semiconductor substrate. The oxide film 214 shown in FIG. 1 is formed by oxidizing the exposed semiconductor substrate which is exposed by the trench. If different amounts of nitrogen are contained in the sidewalls and bottom of the trench, the oxide film 214 may be formed to have different thicknesses over the sidewalls and bottom of the trench.

In accordance with one embodiment of the present invention, in order to prevent the electron trap causing the path 210 via which a leakage current occurs, a nitride film formed at the bottom of the trench is removed. Nitrogen (N) is implanted into the semiconductor substrate, so that an oxide film formed at an upper sidewall of the active region is formed to be thicker than an oxide film formed at a lower sidewall of the active region, so that the HEIP phenomenon in the PMOS transistor is reduced.

FIGS. 4A to 4G are cross-sectional views illustrating a method for forming a semiconductor device according to one embodiment of the present invention.

Figure 4A:
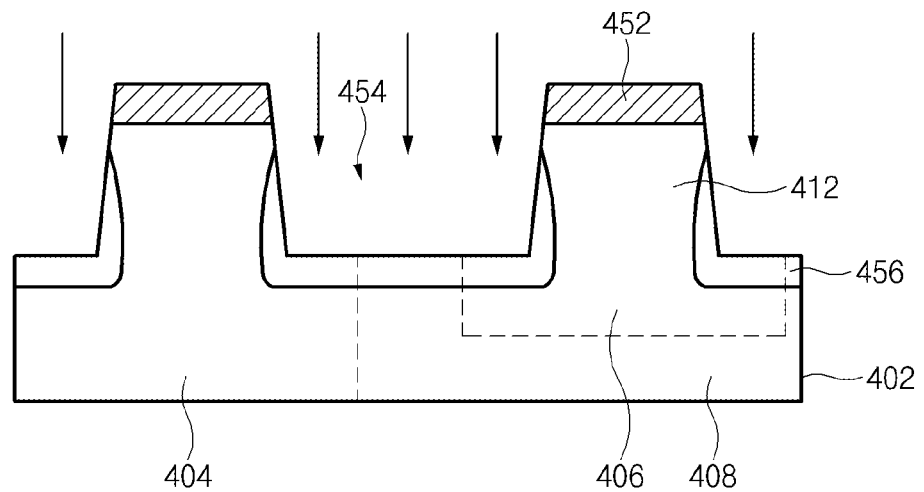
FIGS. 4A to 4G are cross-sectional views illustrating a method for forming a semiconductor device according to one embodiment of the present invention.

Referring to FIG. 4A, a first P-type well region 404, a second P-type well region 406, and an N-type well region 408 are formed over the semiconductor substrate 402. Thereafter, in order to define the active region 412, a hard mask layer 452 is deposited over the semiconductor substrate 402, and the hard mask layer 452 is patterned by an exposure process. Some parts of the semiconductor substrate 402 are etched using the patterned hard mask layer 452 as an etch mask, and thus a trench 454 is formed. Impurities are anisotropically implanted in the trench 454. In this case, the impurities may be nitrogen. If nitrogen is anisotropically, e.g., vertically in respect to the surface of the substrate 402, implanted in the trench 454 having an inclined sidewall, a nitrogen doping region 456 is thicker at the bottom of the trench and lower portions of the sidewalls than the upper portions of the sidewalls of the trench 454. Specifically, the nitrogen doping region 456 may be formed to be very thin at upper sidewalls of the trench 454 (i.e., upper sidewalls of the active region 412), and the hard mask layer 452 may prevent nitrogen from being implanted in the top surface of the active region 412. In addition, since the nitrogen implantation process uses the hard mask layer 452 which was used for forming the trench 454 rather than using an additional mask, a method for manufacturing the semiconductor device according to one embodiment of the present invention can be simplified.

Figure 4B:
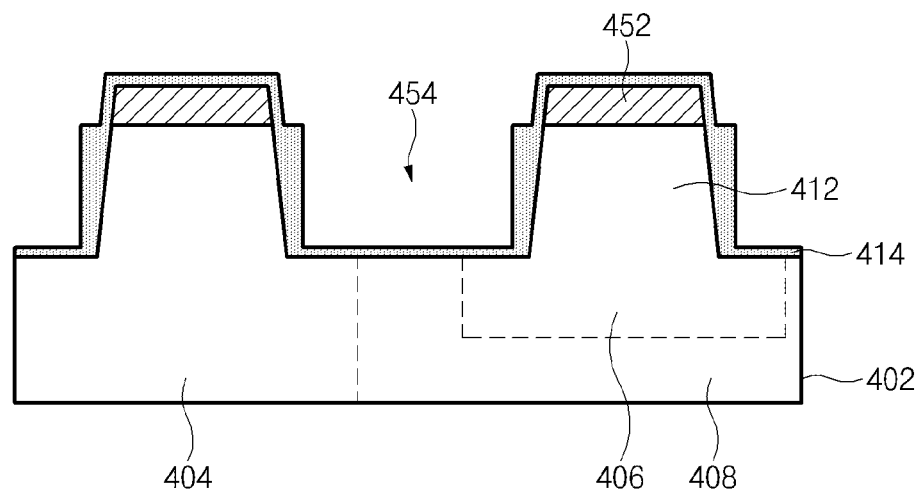

Referring to FIG. 4B, an oxidation process is performed on the semiconductor substrate 402 exposed in the trench 454. In this case, the oxide film 414 is formed in different thicknesses due to the nitrogen doping region 456 present in a different thickness in the bottom and the sidewalls of the trench 454. Referring to FIG. 3, the oxide film 414 is formed to be thin at a lower part of the sidewall of the trench 454 where the nitrogen doping region 456 is thicker, and the oxide film 414 is formed to be thicker at an upper part of the sidewall of the trench 454 where the nitrogen doping region 456 is thin. Specifically, the oxide film 414 is thickly formed at an upper part of sidewalls of the trench 454, so that it can help prevent the HEIP phenomenon in the PMOS transistor.

Figure 4C:
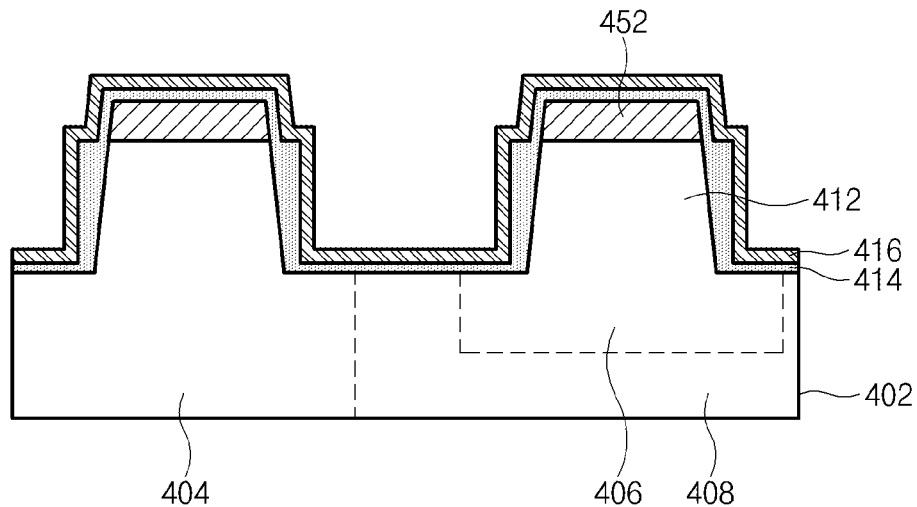

Referring to FIG. 4C, a nitride film 416 is deposited over the oxide film 414. In this case, in a subsequent process, the nitride film 416 reduces the amount of stress applied to the active region 412 and also prevents impurities from diffusing into the active region 412.

Figure 4D:
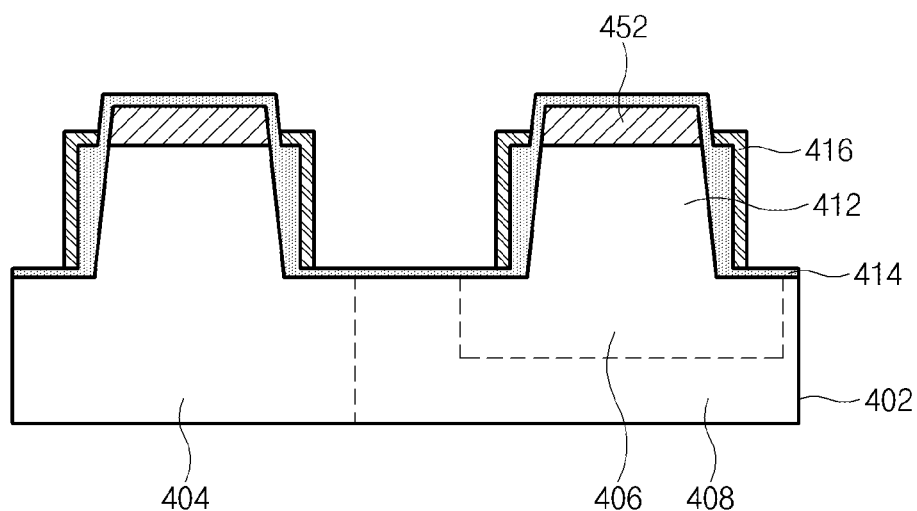

Referring to FIG. 4D, an anisotropic etch process such an as etch-back process is performed, so that the nitride film 416 formed at the bottom of the trench 454 is removed and the nitride film 416 remains over sidewalls of the trench 454.

Figure 4E:
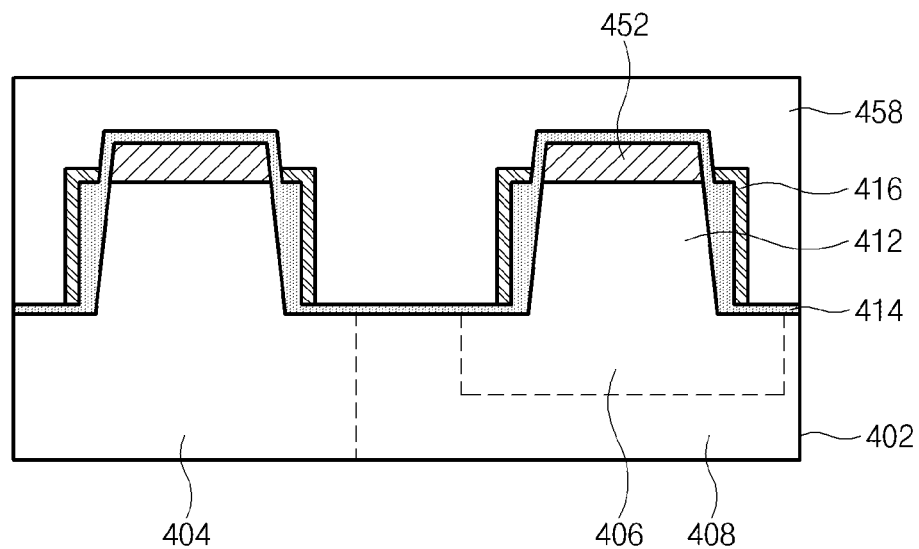

Referring to FIG. 4E, an insulation material 458 is deposited over the trench 454.

Figure 4F:
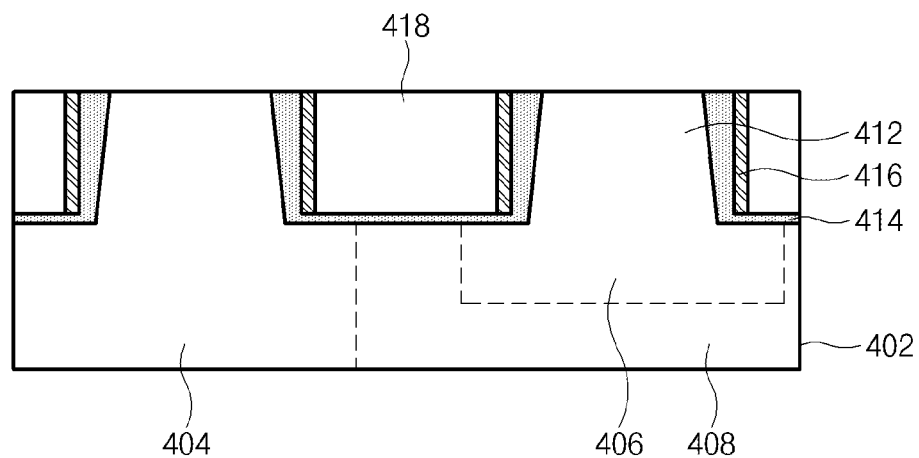

Referring to FIG. 4F, planarization is performed to expose the top surface of the active region 412, so that a device isolation film 418 filling in the trench 454 is formed. In this case, a chemical mechanical polishing (CMP) process may be performed by planarization.

Figure 4G:
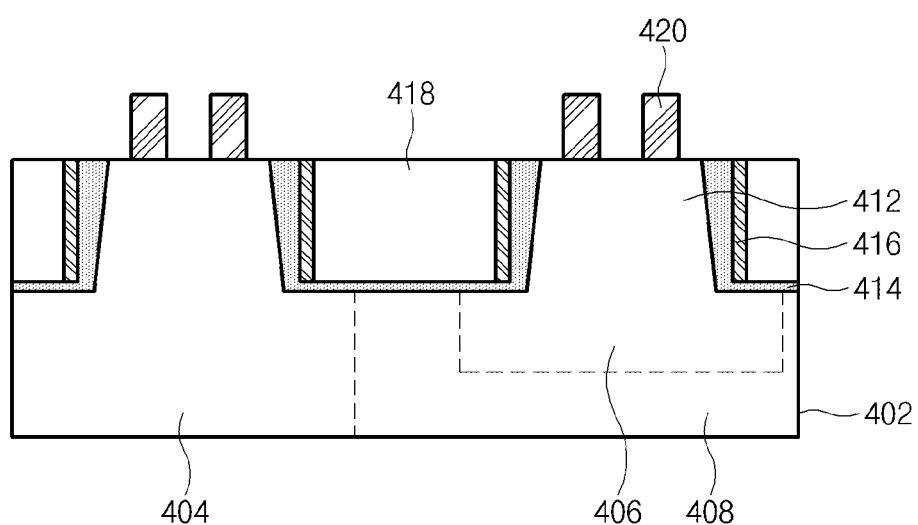

Referring to FIG. 4G, a gate pattern 420 is formed over the active region 412.

As described above, the method for manufacturing the semiconductor device according to one embodiment of the present invention performs an oxidation process after implanting nitrogen, so that the oxide film 414 is formed relatively thicker at the upper sidewalls of the trench 454 and thus device isolation between two neighboring active regions can be properly made with the relatively narrower device isolation film 418. As a result, the trench 454 does not need to be formed deeply for complete isolation, and thus the trench 454 can be easily gap-filled with an insulation material. Thus, it can prevent a void from being generated in the device isolation film 418.

In addition, since the nitride film 416 is removed from the bottom of the trench 454, a path 210 composed of holes is not formed in an N-type well region 408 at the bottom of the trench 454 due to the occurrence of trapped electrons. Therefore, a path via which a current flows between the first and second P-type well regions 404 and 406 disappears, so that the amount of leakage current is reduced.

As is apparent from the above description, the semiconductor device and a method for manufacturing the same according to embodiments of the present invention have the following effects.

In accordance with the method for manufacturing the above-mentioned highly-integrated semiconductor device, a trench is formed, nitrogen is implanted in a sidewall and bottom of the trench, and an oxidation process is performed, so that a thick oxide film may be formed at an upper part of sidewalls of the trench, reducing the chance of a HEIP phenomenon. In addition, a thin oxide film is formed at the remaining sidewall and bottom part of the trench, so that an insulation material can easily fill in the trench.

In addition, embodiments of the present invention form a nitride film over sidewalls of the trench, and remove the nitride film formed at the bottom of the trench, so that electrical insulation between neighboring active regions can be increased.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for manufacturing a semiconductor device comprising:
   forming a trench for defining a first active region and a second active region over a semiconductor substrate, the trench being provided between first and second active regions;
   forming a doped region by implanting impurities into the trench;
   forming an oxide film in the trench by an oxidation process;
   forming a nitride film at inner sidewalls of the trench; and
   forming a device isolation film in the trench,
   wherein a thickness of the oxide film formed at inner sidewalls of the trench is larger than that of the oxide film formed over the bottom of the trench.

2. The method according to claim 1, wherein the impurities comprise nitrogen.

3. The method according to claim 1, further comprising:
   forming a gate pattern over the first active region and the second active region.

4. The method according to claim 1, wherein the forming of the trench defining the first active region and the second active region over the semiconductor substrate includes:
   depositing a hard mask layer over the semiconductor substrate;
   patterning the hard mask layer by an exposure process; and
   etching the semiconductor substrate by using the patterned hard mask layer as an etch mask.

5. The method according to claim 1, wherein the forming of the doped region by implanting impurities into the trench includes anisotropically implanting the impurities.

6. The method according to claim 1, wherein a portion of the doped region at a lower sidewall and bottom of the trench is thicker than a portion of the doped region at an upper sidewall of the trench.

7. The method according to claim 1, wherein, a thickness of the oxide film formed at inner sidewalls of the trench is different from that of the oxide film formed over the bottom of the trench.

8. The method according to claim 1, wherein the forming of the nitride film at inner sidewalls of the trench includes:
   depositing the nitride film over the oxide film; and
   anisotropically etching the nitride film, and exposing the oxide film formed at the bottom of the trench.

9. The method according to claim 1, wherein the forming of the device isolation film in the trench includes:
   depositing an insulation material in the trench; and
   planarizing the insulation material so that the top surface of the substrate in the active region is exposed.

10. The method according to claim 1, wherein the first active region and the second active region are formed of a P-type well region, and neighboring P-type well regions are electrically isolated from each other by a N-well region.

11. A semiconductor device comprising:
    a device isolation structure provided between first and second active regions, the device isolation structure provided in a trench;
    an oxide film having a first portion and a second portion, the first portion of the oxide film being disposed between inner sidewalls of the trench and a side portion of the device isolation structure and the second portion of the oxide film being disposed between a bottom of the trench and a lower portion of the device isolation structure; and
    a nitride film disposed between the first portion of the oxide film and the side portion of the device isolation structure,
    wherein a thickness of the first portion of the oxide film is larger than a thickness of the second portion of the oxide film.

12. The semiconductor device according to claim 11, further comprising:
    a gate pattern formed over the first active region and the second active region.

13. The semiconductor device according to claim 11, further comprising:
    a P-type well region disposed in the first active region; and
    an N-type well region disposed at the bottom of the trench so as to isolate neighboring P-type well regions.

14. The semiconductor device according to claim 11, wherein the second portion of the oxide film couples the bottom of the device isolation structure and the nitride film couples the side portion of the device isolation structure.

15. A semiconductor device comprising:
    a substrate including an active region and a device isolation structure;
    a first oxide layer formed between an upper sidewall of the device isolation structure and the substrate in the active region;
    a second oxide layer formed between a lower sidewall of the device isolation structure and the substrate in the active region; and
    a third oxide layer formed between a bottom of the device isolation structure and the substrate in the device isolation region;
    wherein the first oxide layer is thicker than the second oxide layer.

16. The semiconductor device according to claim 15, wherein the device further comprising:
    a nitride layer formed between the first oxide layer and the device isolation structure and between the second oxide layer and the device isolation structure,
    wherein substantially no nitride layer is formed between the third oxide layer and the device isolation structure.

17. The semiconductor device according to claim 15, wherein the first and the second oxide layer is in an integrated body and tapered widening upwards.

18. The semiconductor device according to claim 15, wherein the active region is formed of a first type well, and the device isolation region is formed of a second type well opposite to the first type well in electric polarity.

* * * * *